United States Patent
Mokhlesi et al.

(10) Patent No.: US 7,463,528 B2
(45) Date of Patent: Dec. 9, 2008

(54) TEMPERATURE COMPENSATION OF SELECT GATES IN NON-VOLATILE MEMORY

(75) Inventors: Nima Mokhlesi, Los Gatos, CA (US); Dengtao Zhao, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/958,534

(22) Filed: Dec. 18, 2007

(65) Prior Publication Data

US 2008/0094930 A1    Apr. 24, 2008

Related U.S. Application Data

(62) Division of application No. 11/424,800, filed on Jun. 16, 2006, now Pat. No. 7,391,650.

(51) Int. Cl.
G11C 11/34  (2006.01)
G11C 16/06  (2006.01)

(52) U.S. Cl. .............................. 365/185.22; 365/185.17; 365/185.18; 365/185.23

(58) Field of Classification Search ............ 365/185.17, 365/185.18, 185.22, 185.23
See application file for complete search history.

(56) References Cited

U.S. PATENT DOCUMENTS

| | | | |
|---|---|---|---|
| 5,172,338 A | 12/1992 | Mehrotra | |
| 5,386,422 A | 1/1995 | Endoh | |
| 5,522,580 A | 6/1996 | Varner, Jr. | |
| 5,570,315 A | 10/1996 | Tanaka | |
| 5,774,397 A | 6/1998 | Endoh | |
| 5,864,504 A | 1/1999 | Tanzawa | |
| 6,026,023 A | 2/2000 | Tonda | |
| 6,046,935 A | 4/2000 | Takeuchi | |
| 6,205,074 B1 | 3/2001 | Van Buskirk | |
| 6,222,762 B1 | 4/2001 | Guterman | |
| 6,400,615 B2 | 6/2002 | Einaga | |
| 6,456,528 B1 | 9/2002 | Chen | |
| 6,462,998 B1 * | 10/2002 | Proebsting | 365/205 |
| 6,522,580 B2 | 2/2003 | Chen | |
| 6,560,152 B1 | 5/2003 | Cernea | |
| 6,667,904 B2 | 12/2003 | Takeuchi | |
| 6,801,454 B2 | 10/2004 | Wang | |

(Continued)

OTHER PUBLICATIONS

International Search Report, PCT/US2007/069709, dated Jan. 22, 2008.

(Continued)

*Primary Examiner*—Ly D Pham
(74) *Attorney, Agent, or Firm*—Vierra Magen Marcus & DeNiro LLP

(57) ABSTRACT

Reading and verify operations are performed on non-volatile storage elements using temperature-compensated read voltages for unselected word lines, and/or for select gates such as drain or source side select gates of a NAND string. In one approach, while a read or verify voltage is applied to a selected word line, temperature-compensated read voltages are applied to unselected word lines and select gates. Word lines which directly neighbor the selected word line can receive a voltage which is not temperature compensated, or which is temperature-compensated to a reduced degree. The read or verify voltage applied to the selected word line can also be temperature-compensated. The temperature compensation may also account for word line position.

20 Claims, 16 Drawing Sheets

U.S. PATENT DOCUMENTS

| | | |
|---|---|---|
| 6,839,281 B2 | 1/2005 | Chen |
| 6,859,397 B2 | 2/2005 | Lutze |
| 6,870,766 B2 | 3/2005 | Cho |
| 6,954,394 B2 | 10/2005 | Knall |
| 7,046,568 B2 | 5/2006 | Cernea |
| 7,120,051 B2 | 10/2006 | Gorobets et al. |
| 7,196,928 B2 | 3/2007 | Chen |
| 7,237,074 B2 | 6/2007 | Guterman et al. |
| 2002/0109539 A1 | 8/2002 | Takeuchi et al. |
| 2002/0159315 A1 | 10/2002 | Noguchi et al. |
| 2004/0057287 A1 | 3/2004 | Cernea |
| 2004/0105308 A1* | 6/2004 | Matsunaga et al. ..... 365/185.11 |
| 2004/0109357 A1 | 6/2004 | Cernea |
| 2004/0255090 A1 | 12/2004 | Guterman |
| 2005/0024939 A1 | 2/2005 | Chen |
| 2005/0036369 A1 | 2/2005 | Lee |
| 2005/0078537 A1 | 4/2005 | So |
| 2005/0213387 A1 | 9/2005 | Kubo |
| 2006/0126390 A1 | 6/2006 | Gorobets |
| 2006/0140007 A1 | 6/2006 | Cernea |
| 2006/0158947 A1 | 7/2006 | Chan |
| 2006/0291322 A1 | 12/2006 | Crippa |
| 2007/0206421 A1 | 9/2007 | Mokhlesi |

OTHER PUBLICATIONS

U.S. Appl. No. 11/424,800, filed Jun. 16, 2006, titled "Method for operating non-volatile memory using temperature compensation of voltages of unselected word lines and select gates,".

U.S. Appl. No. 11/424,812, filed Jun. 16, 2006, titled "System for operating non-volatile memory using temperature compensation of voltages of unselected word lines and select gates".

U.S. Appl. No. 11/958,524, filed Dec. 18, 2007, titled "Temperature compensation of voltages of unselected word lines in non-volatile memory based on word line position,".

Notice of Allowance dated Sep. 9, 2008, U.S. Appl. No. 11/958,524, filed Dec. 18, 2007.

* cited by examiner

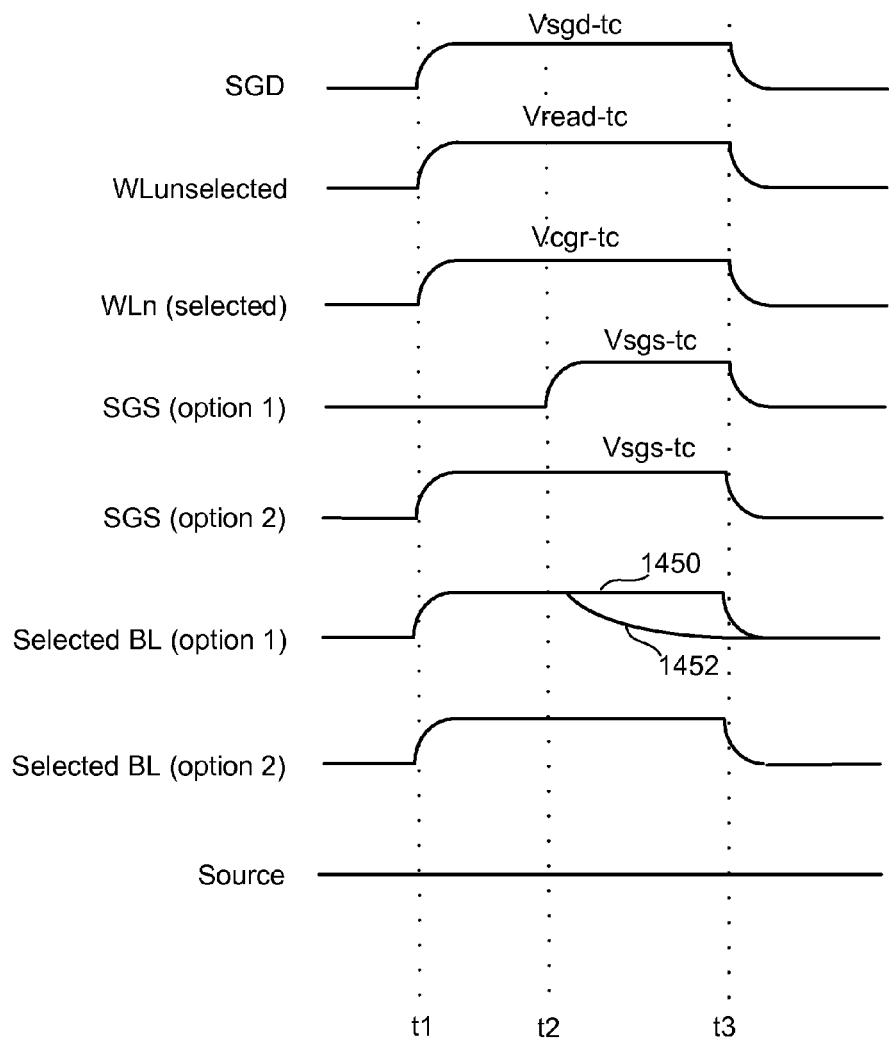

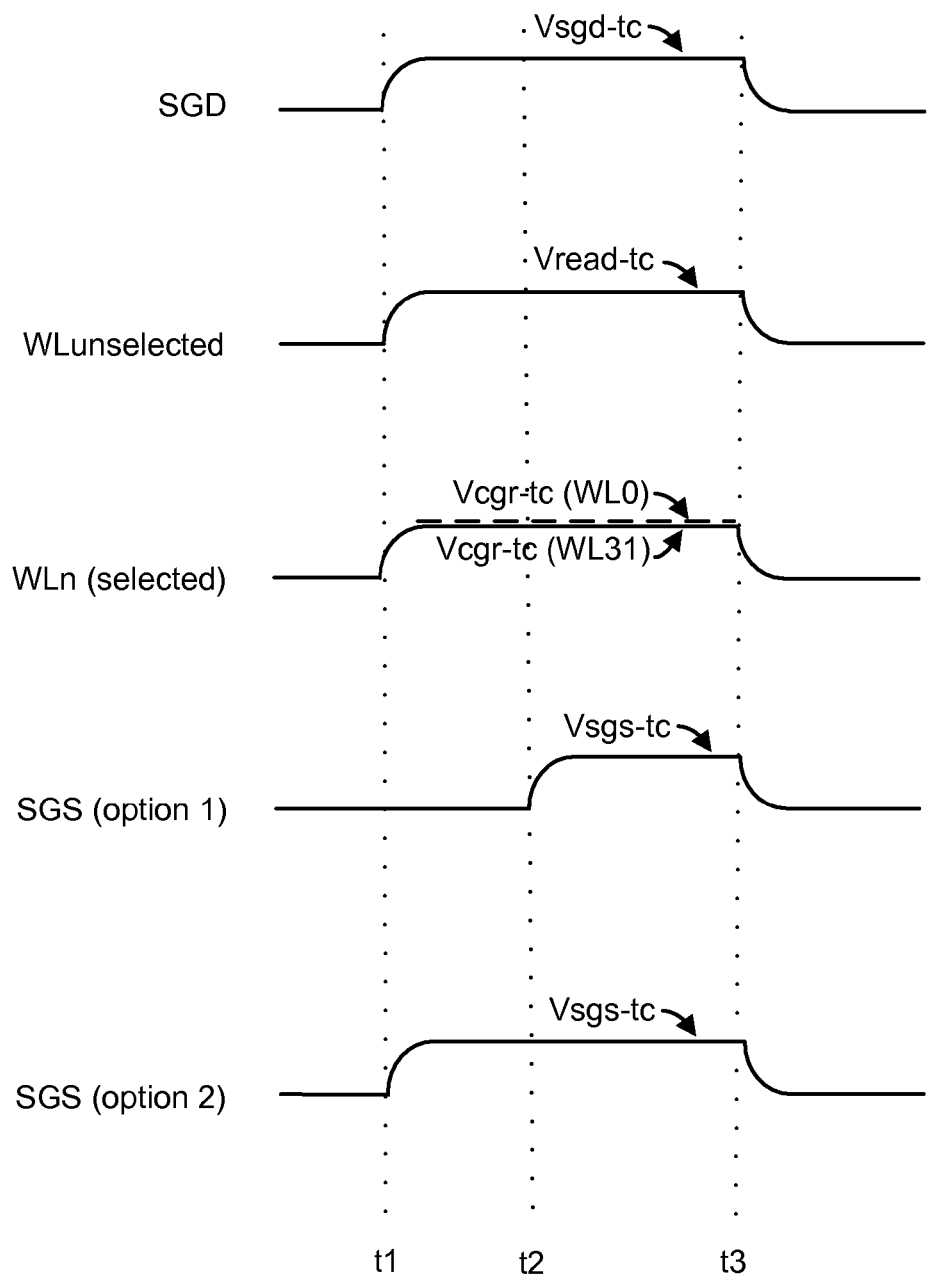

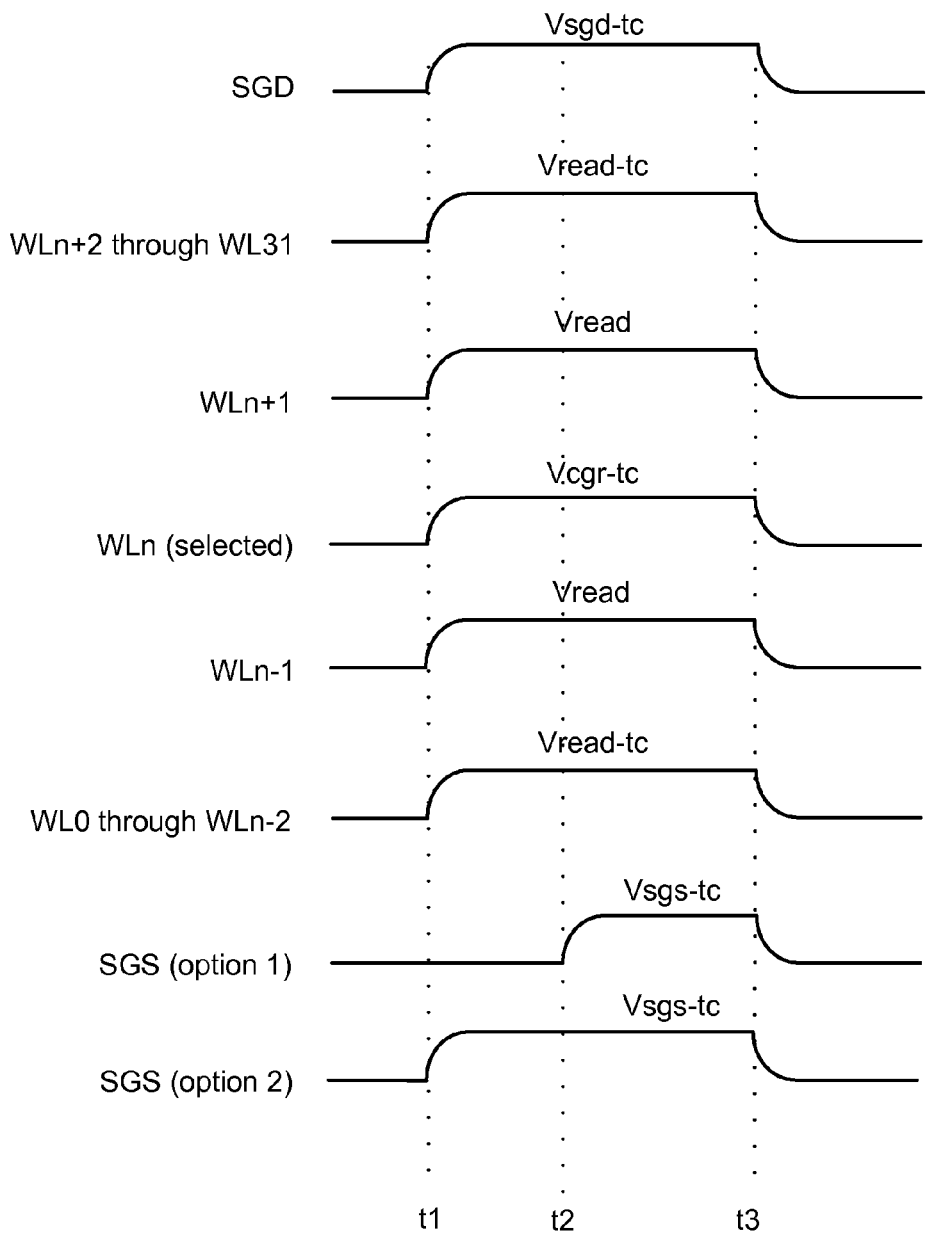

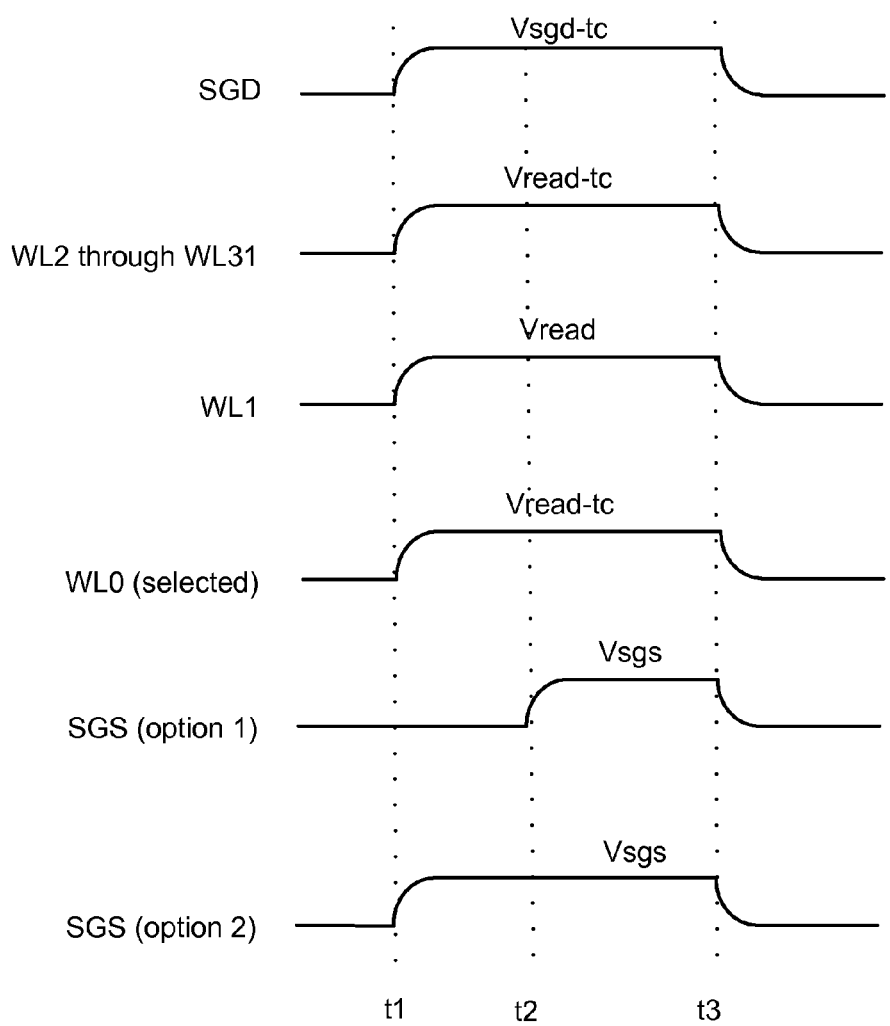

TEMPERATURE COMPENSATION OF SELECT GATES IN NON-VOLATILE MEMORY

CROSS-REFERENCE TO RELATED APPLICATIONS

This application is a divisional of U.S. patent application Ser. No. 11/424,800, titled "Method For Operating Non-Volatile Memory Using Temperature Compensation Of Voltages Of Unselected Word Lines And Select Gates", filed Jun. 16, 2006, incorporated herein by reference.

This application is related to U.S. patent application Ser. No. 11/424,812, titled "System For Operating Non-Volatile Memory Using Temperature Compensation Of Voltages Of Unselected Word Lines And Select Gates", filed Jun. 16, 2006, incorporated herein by reference.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the storage element is raised so that the storage element is in a programmed state. More information about programming can be found in U.S. Pat. No. 6,859,397, titled "Source Side Self Boosting Technique for Non-Volatile Memory;" and in U.S. Pat. No. 6,917,542, titled "Detecting Over Programmed Memory;" both patents are incorporated herein by reference in their entirety.

Some EEPROM and flash memory devices have a floating gate that is used to store two ranges of charges and, therefore, the storage element can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

In present non-volatile storage devices, such as NAND flash memory devices, temperature variations present various issues in reading and writing data. A memory device is subject to varying temperatures based on the environment in which it is located. For example, some current memory devices are rated for use between −40° C. and +85° C. Devices in industrial, military and even consumer applications may experience significant temperature variations. Temperature affects many transistor parameters, the dominant among which is the threshold voltage. In particular, temperature variations can cause read errors and widen the threshold voltage distributions of the different states of a non-volatile storage element. Currently, temperature variations are compensated for by changing the read/verify voltages applied to a selected word line in a way which accounts for the temperature variation of a selected storage element's threshold voltage. This approach can, at best, address the average shift in the distribution of threshold voltages of a storage element which, for simplicity, are all assumed to be in the same data state. However, an improved technique is needed for further reducing the spread of each state's threshold voltage distribution resulting from changes in temperature.

SUMMARY OF THE INVENTION

The present invention addresses the above and other issues by providing a system and method for operating non-volatile storage in which temperature-compensated voltages are applied to unselected non-volatile storage elements and/or select gates. Various benefits are achieved, including improved read and write performance.

In one embodiment, non-volatile storage is operated by applying a first voltage, such as a read or verify voltage, to a selected word line to determine a programming condition of a first non-volatile storage element which is associated with the selected word line. The first non-volatile storage element is provided in a set of non-volatile storage elements. For instance, the first voltage can be a read voltage for reading the programming state of first non-volatile storage element after it has been programmed. Or, the first voltage can be a verify voltage for verifying whether the first non-volatile storage element has a reached a desired programming state. Such a verify voltage can be applied between individual programming pulses in a series of such pulses, for instance. Also, a temperature-compensated voltage is applied to one or more unselected word lines that are associated with the set of non-volatile storage elements, while the first voltage is applied.

In one approach, the same temperature-compensated voltage is applied to each of the unselected word lines. In another approach, different temperature-compensated voltages are applied to different unselected word lines. In yet another approach, one or both unselected word lines which are direct neighbors of the selected word line receive either a voltage which is not temperature-compensated, or is temperature-compensated by a reduced amount relative to the temperature-compensated voltage applied to the other unselected word lines. A temperature-compensated voltage can also be applied to source and/or drain select gates, such as when the selected non-volatile storage element is in a NAND string. The first voltage can be temperature-compensated as well.

In another embodiment, non-volatile storage is operated by applying a first voltage to a selected word line to determine a programming condition of a first non-volatile storage element which is associated with the selected word line. The first non-volatile storage element is provided in a set of non-volatile storage elements. Additionally, the first voltage is temperature-compensated according to a relative position of the selected word line among a plurality of word lines which are associated with the set of non-volatile storage elements. For example, a greater magnitude of temperature compensation can be used when the selected word line is closer to a drain than to a source of a block which includes the plurality of word lines.

In another embodiment, non-volatile storage is operated by applying a first voltage to a selected word line to determine a programming condition of a first non-volatile storage element which is associated with the selected word line, where the first non-volatile storage element is provided in a set of non-volatile storage elements. A temperature-compensated voltage is applied to least a first unselected word line which is associated with the set of non-volatile storage elements, while the first voltage is applied. Additionally, a voltage which is not temperature-compensated, or is temperature-compensated by a reduced amount relative to the temperature-compensated voltage applied to the first unselected word line, is applied to at least a second unselected word line which is associated with the set of non-volatile storage elements, while the first voltage is applied. In one approach, the at least a first unselected word line is not a direct neighbor of the selected word line, while the at least a second unselected word line is a direct neighbor of the selected word line.

In yet another embodiment, non-volatile storage is operated by applying a first voltage to a selected word line to determine a programming condition of a first non-volatile storage element which is associated with the selected word line, where the first non-volatile storage element is provided in a set of non-volatile storage elements. A first temperature-compensated voltage is applied to a select gate associated with first non-volatile storage element, while the first voltage is applied, when the first non-volatile storage element is not a direct neighbor of the select gate. A voltage which is not temperature-compensated, or is temperature-compensated by a reduced amount relative to the first temperature-compensated voltage, is applied to the select gate, while the first voltage is applied, when the first non-volatile storage element is a direct neighbor of the select gate. The select gate and the first non-volatile storage element can be provided in a NAND string, where the select gate is at a source or drain side of the NAND string.

Corresponding methods for operating non-volatile storage and non-volatile storage systems are provided. The non-volatile storage systems include a set of non-volatile storage elements, and one or more circuits for operating the set of non-volatile storage elements as discussed herein.

BRIEF DESCRIPTION OF THE DRAWINGS

FIG. 15a is a timing diagram that explains the behavior of certain waveforms during read/verify operations, where temperature-compensated voltages are applied to all unselected word lines and to both select gates.
FIG. 15b depicts the timing diagram of FIG. 15a in which different temperature-compensated voltages are applied to the selected word line based on word line position.
FIG. 16 is a timing diagram that explains the behavior of certain waveforms during read/verify operations, where temperature-compensated voltages are applied to all unselected word lines, except the word lines directly neighboring a selected word line, and to both select gates.
FIG. 17 is a timing diagram that explains the behavior of certain waveforms during read/verify operations, where the selected word line directly neighbors a source side select gate.

DETAILED DESCRIPTION

The present invention provides a system and method for operating non-volatile storage in a manner which improves read and write performance. Improved performance is achieved by applying temperature-compensated voltages to unselected non-volatile storage elements and/or select gates. Specific benefits can include reduced read disturbs, reduced margins between programmed states, improved write performance due to the use of larger programming step size, and/or reduced operating window by packing states closer together.

Figure 1:
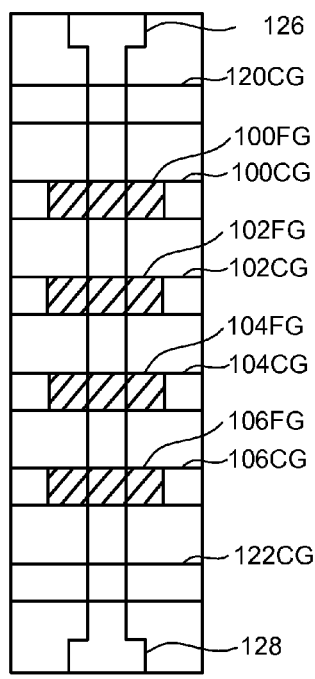
FIG. 1 is a top view of a NAND string.
Figure 2:
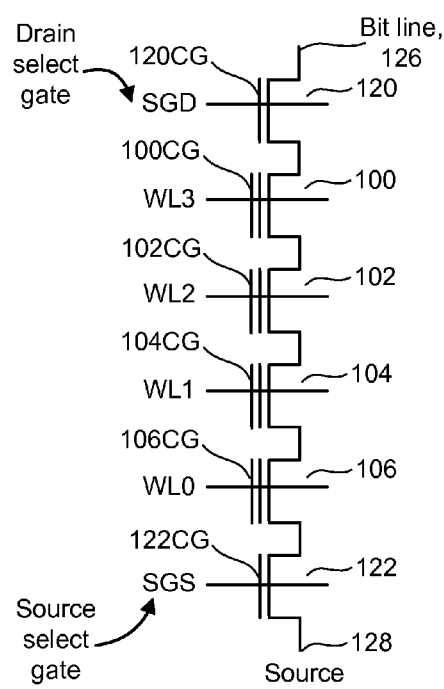
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
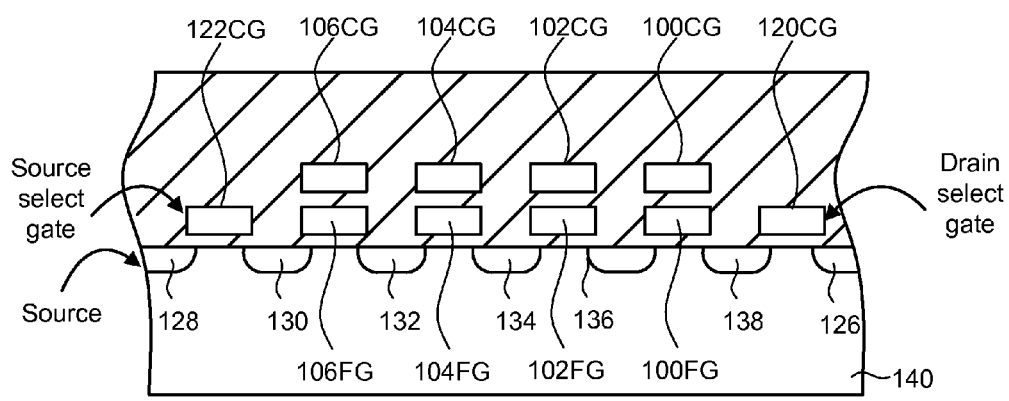
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The control gates and the floating gates are typically formed by depositing polysilicon layers. The floating gates are formed on the surface of the p-well on top of an oxide or other dielectric film. The control gate is above the floating gate, with an inter-polysilicon dielectric layer separating the control gate and floating gate. The control gates of the storage elements (100, 102, 104 and 106) form the word lines. N+ doped diffusion regions 130, 132, 134, 136 and 138 are shared between neighboring storage elements, through which the storage elements are connected to one another in series to form a NAND string. These N+ doped regions form the source and drain of each of the storage elements. For example, N+ doped region 130 serves as the drain of transistor 122 and the source for transistor 106, N+ doped region 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped region 138 serves as the drain for transistor 100 and the source for transistor 120. N+ doped region 126 connects to the bit line for the NAND string, while N+ doped region 128 connects to a common source line for multiple NAND strings.

Note that although FIGS. 1-3 show four storage elements in the NAND string, the use of four transistors is provided only as an example. A NAND string used with the technology described herein can have less than four storage elements or more than four storage elements. For example, some NAND strings will include eight, sixteen, thirty-two or sixty-four storage elements, etc. The discussion herein is not limited to any particular number of storage elements in a NAND string.

Each storage element can store data represented in analog or digital form. When storing one bit of digital data, the range of possible threshold voltages of the storage element is divided into two ranges, which are assigned logical data "1" and "0." In one example of a NAND-type flash memory, the threshold voltage is negative after the storage element is erased, and defined as logic "1." The threshold voltage is positive after a program operation, and defined as logic "0." When the threshold voltage is negative and a read is attempted by applying 0 V to the control gate, the storage element will turn on to indicate logic one is being stored. When the threshold voltage is positive and a read operation is attempted by applying 0 V to the control gate, the storage element will not turn on, which indicates that logic zero is stored.

A storage element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the storage element and the threshold voltage ranges of the storage element depends upon the data encoding scheme adopted for the storage elements. For example, U.S. Pat. No. 6,222,762 and U.S. patent application Ser. No. 10/461,244, "Tracking Cells For A Memory System," filed on Jun. 13, 2003, (now U.S. Pat. No. 7,237,074), both of which are incorporated herein by reference in their entirety, describe various data encoding schemes for multistate flash storage elements.

Relevant examples of NAND-type flash memories and their operation are provided in the following U.S. patents/patent applications, all of which are incorporated herein by reference in their entirety: U.S. Pat. Nos. 5,570,315; 5,774,397; 6,046,935; 5,386,422; 6,456,528; and 6,522,580. Other types of non-volatile memory in addition to NAND flash memory can also be used with the present invention.

Another type of storage element useful in flash EEPROM systems utilizes a non-conductive dielectric material in place of a conductive floating gate to store charge in a non-volatile manner. Such a storage element is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the storage element channel. The storage element is programmed by injecting electrons from the storage element channel into the nitride, where they are trapped and stored in a limited region. This stored charge then changes the threshold voltage of a portion of the channel of the storage element in a manner that is detectable. The storage element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar storage element in a split-gate configuration where a doped polysilicon gate extends over a portion of the storage element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The storage elements described in this paragraph can also be used with the present invention. Thus, the technology described herein also applies to coupling between dielectric regions of different storage elements.

Another approach to storing two bits in each storage element has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The storage elements described in this paragraph can also be used with the present invention.

Figure 4:
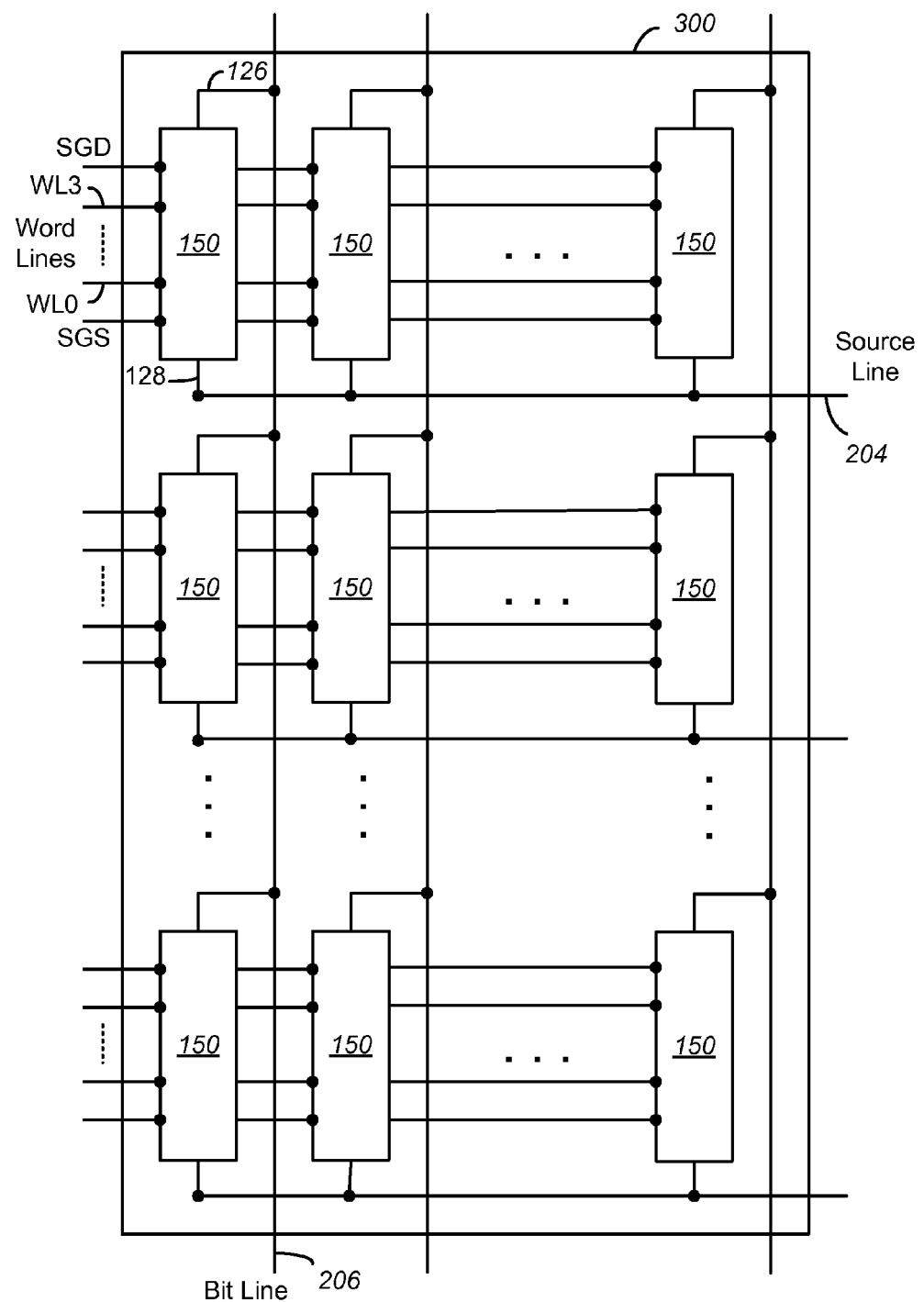
FIG. 4 is a block diagram of an array of NAND flash storage elements.

FIG. 4 illustrates an example of an array of NAND storage elements, such as those shown in FIGS. 1-3. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 5:
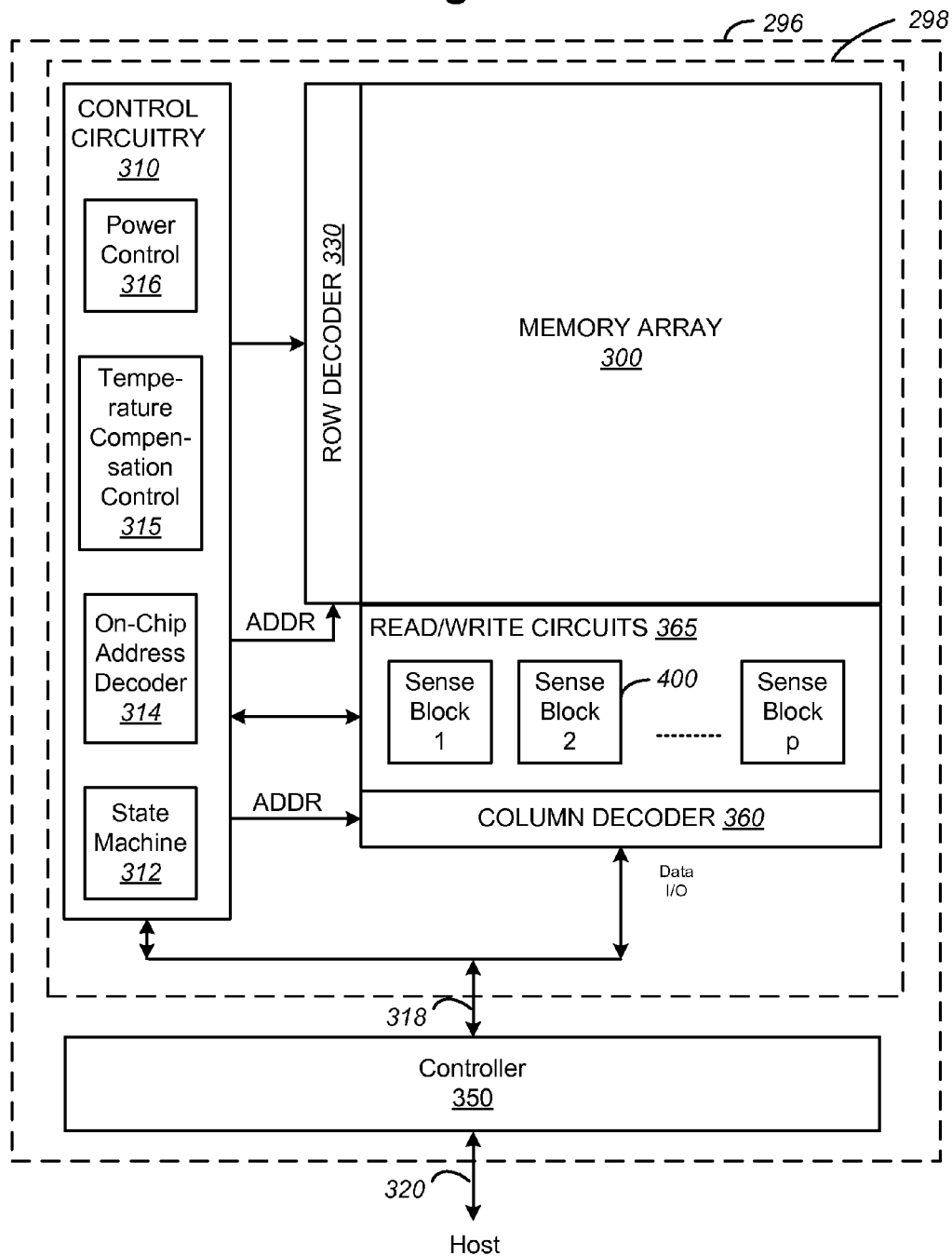
FIG. 5 is a block diagram of a non-volatile memory system.

FIG. 5 illustrates a memory device 296 having read/write circuits for reading and programming a page of storage elements in parallel, according to one embodiment of the present invention. Memory device 296 may include one or more memory die 298. Memory die 298 includes a two-dimensional array of storage elements 300, control circuitry 310, and read/write circuits 365. In some embodiments, the array of storage elements can be three dimensional. The memory array 300 is addressable by word lines via a row decoder 330 and by bit lines via a column decoder 360. The read/write circuits 365 include multiple sense blocks 400 and allow a page of storage elements to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314, a temperature compensation control 315 and a power control module 316. The temperature compensation control 315 is discussed further below, particularly in connection with FIG. 14. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some of the components of FIG. 5 can be combined. In various designs, one or more of the components of FIG. 5 (alone or in combination), other than storage element array 300, can be thought of as a managing circuit. For example, one or more managing circuits may include any one of or a combination of control circuitry 310, state machine 312, decoders 314/360, power control 316, sense blocks 400, read/write circuits 365, controller 350, etc.

Figure 6:
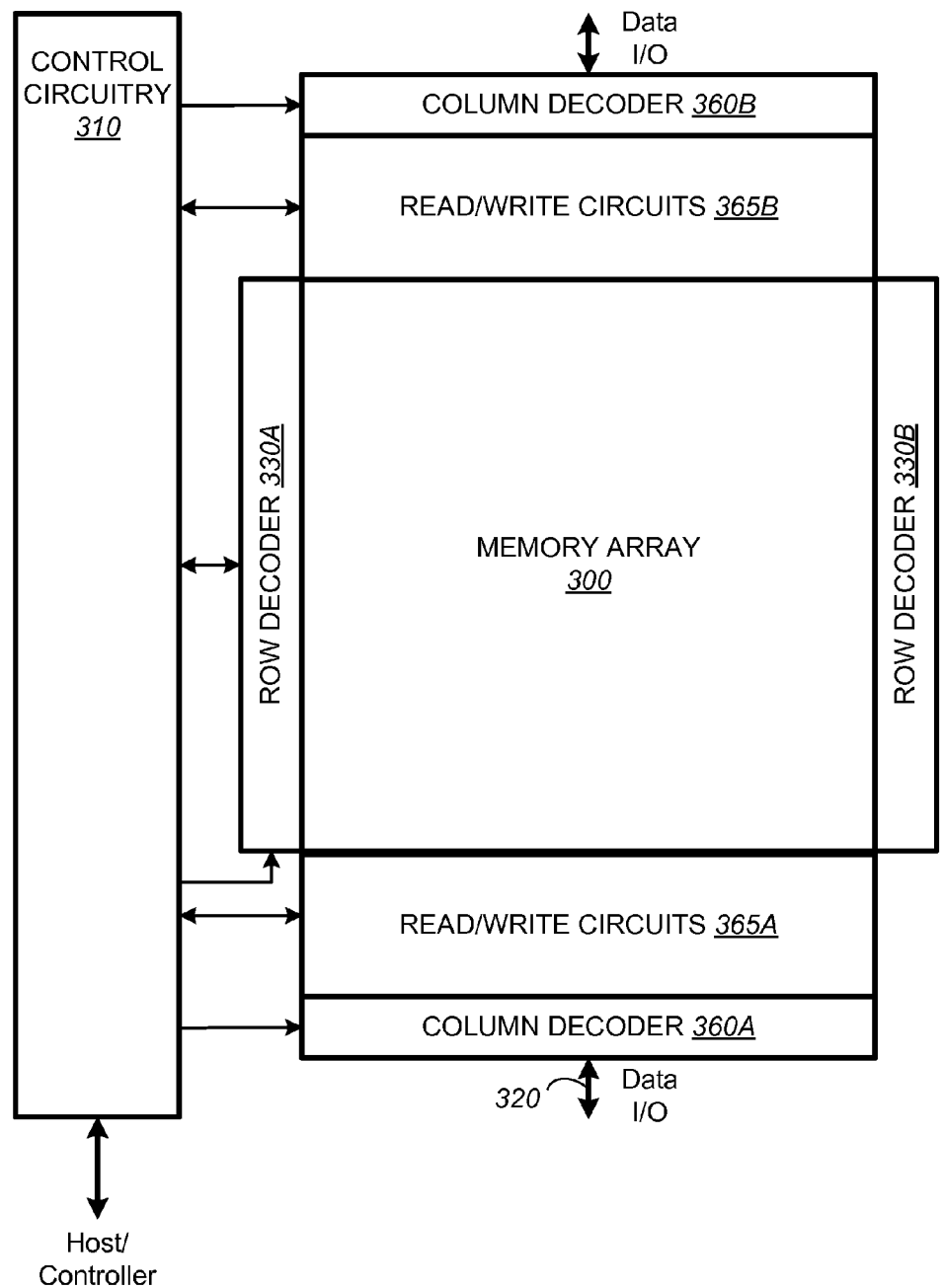
FIG. 6 is a block diagram of a non-volatile memory system.

FIG. 6 illustrates another arrangement of the memory device 296 shown in FIG. 5. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 6 can also include a controller, as described above for the device of FIG. 5.

Figure 7:
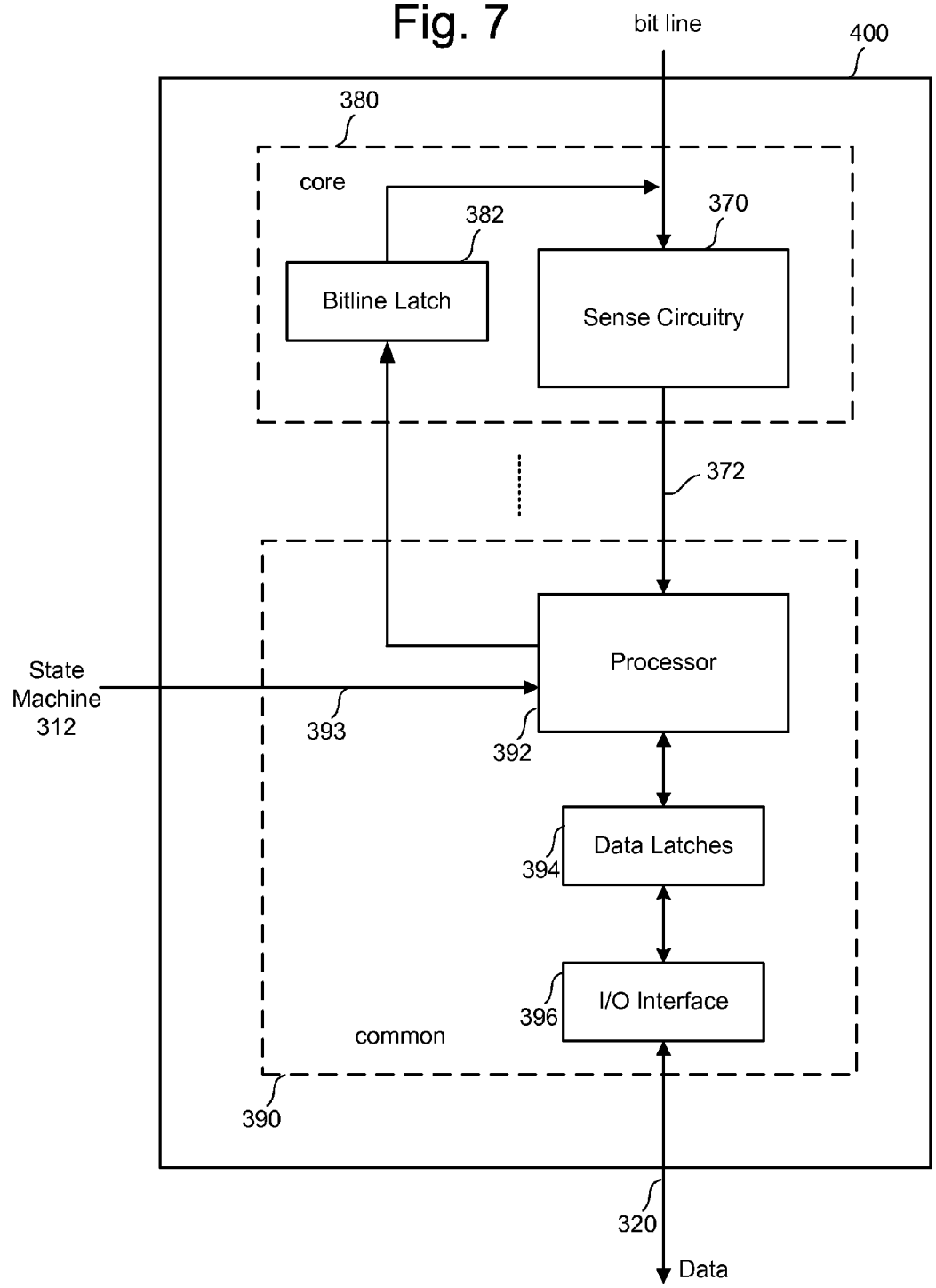
FIG. 7 is a block diagram depicting one embodiment of a sense block.

FIG. 7 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details refer to U.S. patent application Ser. No. 11/026,536 "Non-Volatile Memory & Method with Shared Processing for an Aggregate of Sense Amplifiers" filed on Dec. 29, 2004, (now US 2006/0140007) which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed storage element and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312 that controls the supply of different control gate voltages to the addressed storage element. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 392 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394 from the data bus 320. The program operation, under the control of the state machine, comprises a series of programming voltage pulses applied to the control gates of the addressed storage elements. Each programming pulse is followed by a read back (verify) to determine if the storage element has been programmed to the desired memory state. Processor 392 monitors the read back memory state relative to the desired memory state. When the two are in agreement, the processor 222 sets the bit line latch 214 so as to cause the bit line to be pulled to a state designating program inhibit. This inhibits the storage element coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004 (now U.S. Pat. No. 7,046,568); (4) U.S. patent application Ser. No. 11/099,133, titled "Compensating for Coupling During Read Operations of Non-Volatile Memory," Inventor Jian Chen, filed on Apr. 5, 2005 (U.S. Pat. No. 7,196,928); and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005 (now US 2006/0158947). All five of the immediately above-listed patent documents are incorporated herein by reference in their entirety.

Figure 8:
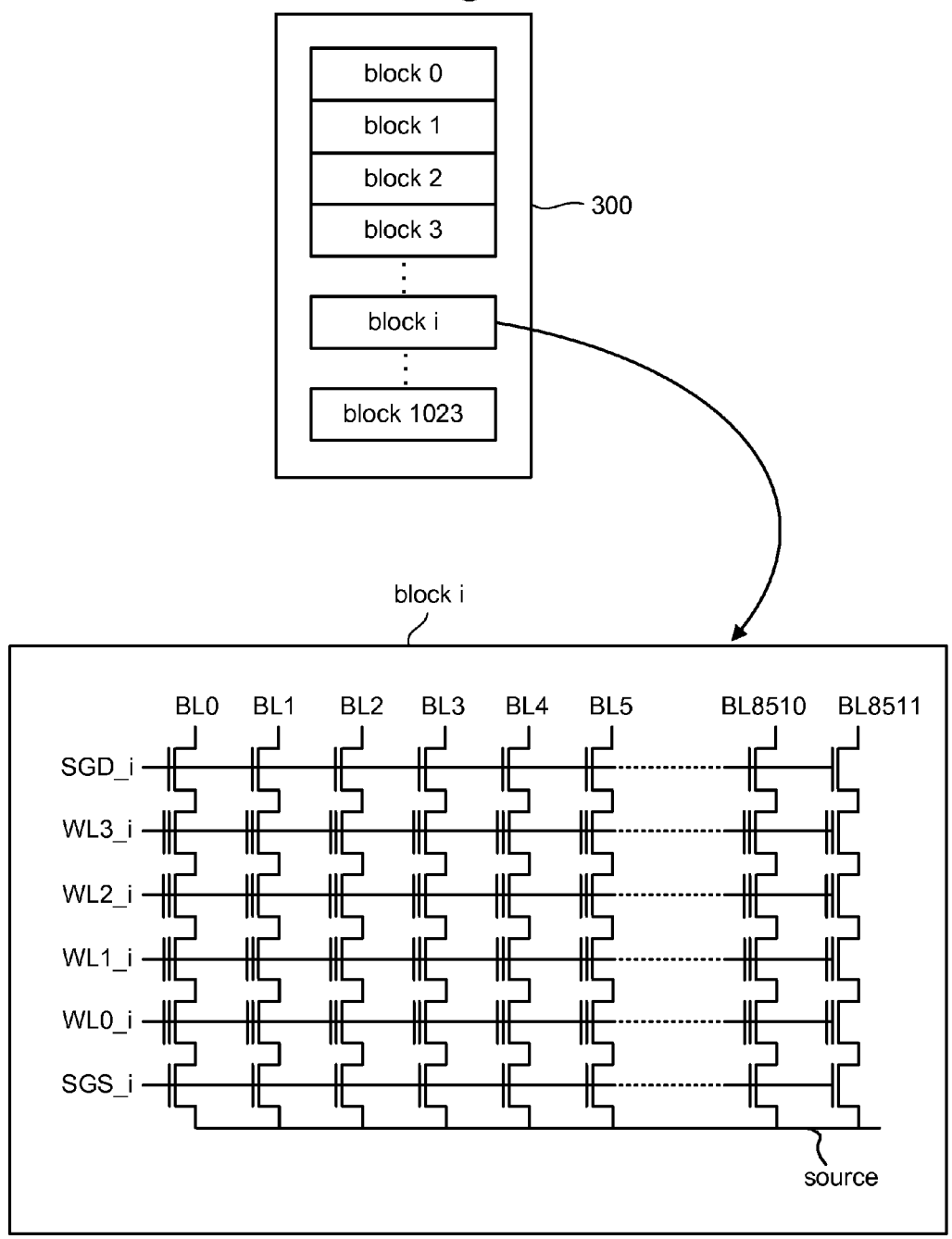
FIG. 8 illustrates an example of an organization of a memory array into blocks for an all bit line memory architecture.

With reference to FIG. 8, an exemplary structure of storage element array 300 is described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment, referred to as an all bit line (ABL) architecture, all the bit lines of a block can be simultaneously selected during read and program operations. Storage elements along a common word line and connected to any bit line can be programmed at the same time.

FIG. 8 shows four storage elements connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain line SGD), and another terminal is connected to c-source via a source select gate (connected to select gate source line SGS).

Figure 9:
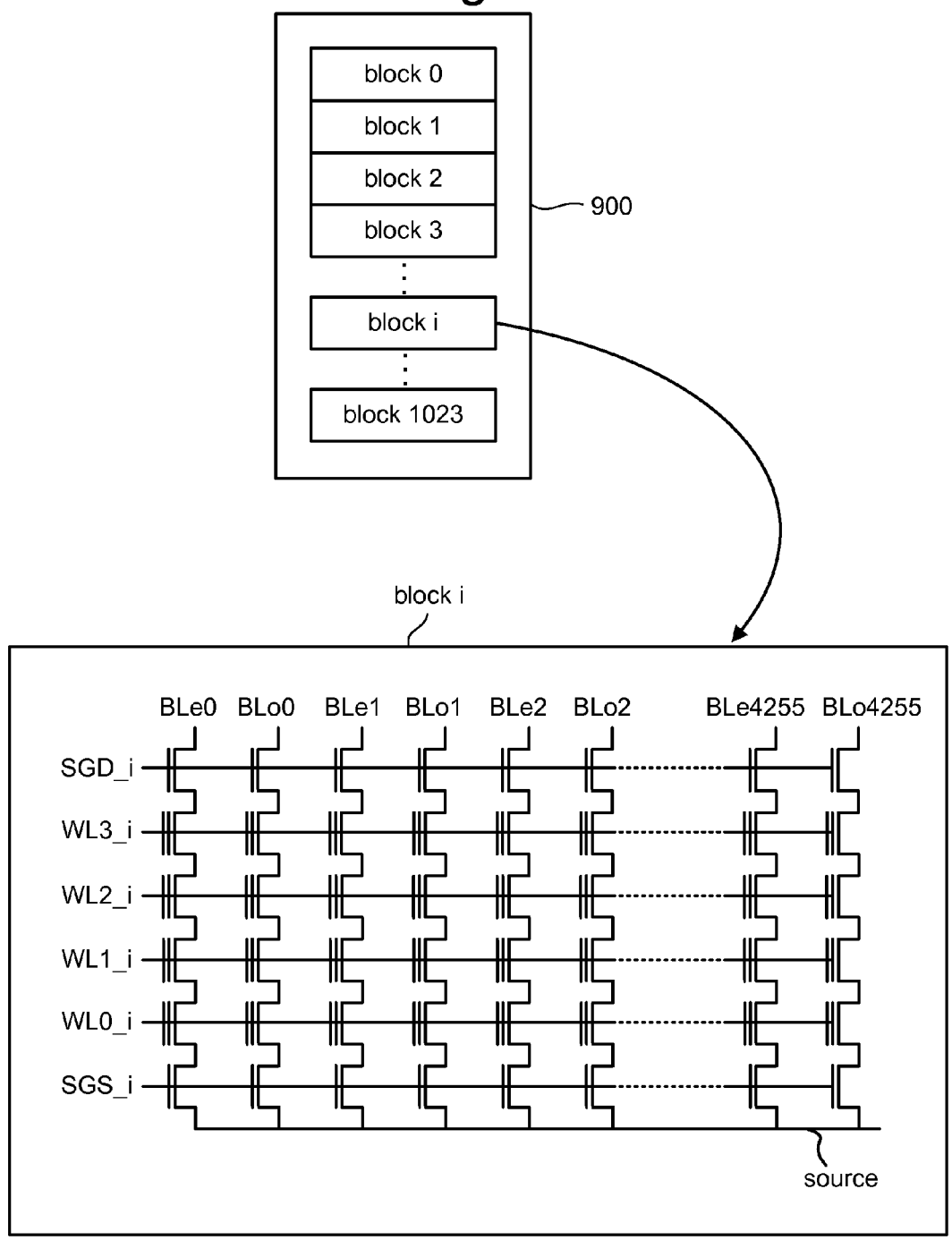
FIG. 9 illustrates an example of an organization of a memory array into blocks for an odd-even memory architecture.

In another embodiment, referred to as an odd-even architecture, the bit lines are divided into even bit lines and odd bit lines, as shown in FIG. 9. FIG. 9 illustrates an example of an organization of a memory array into blocks for an odd-even memory architecture. In an odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. The bit lines are also divided into even bit lines (BLe) and odd bit lines (BLo). In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected.

The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bitline. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 10:
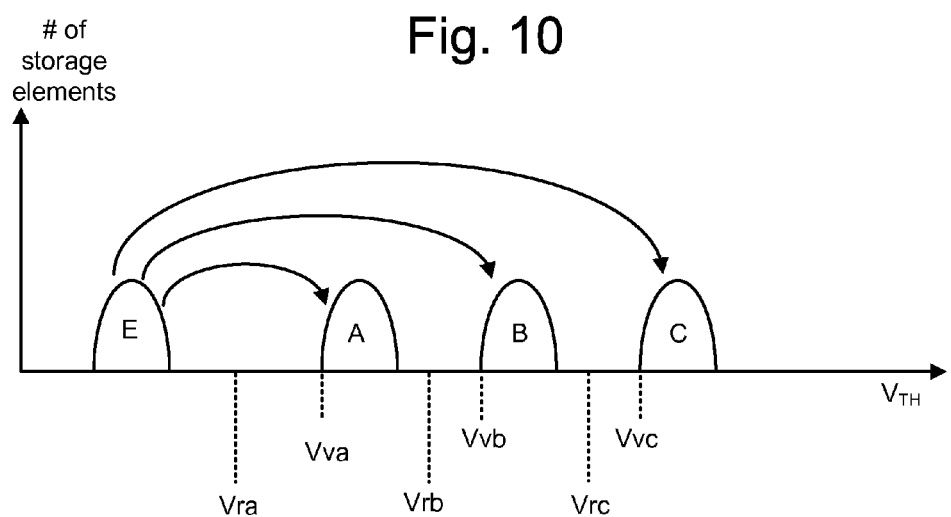
FIG. 10 depicts an example set of threshold voltage distributions.

FIG. 10 illustrates example threshold voltage distributions for the storage element array when each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine what state the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 13 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 11:
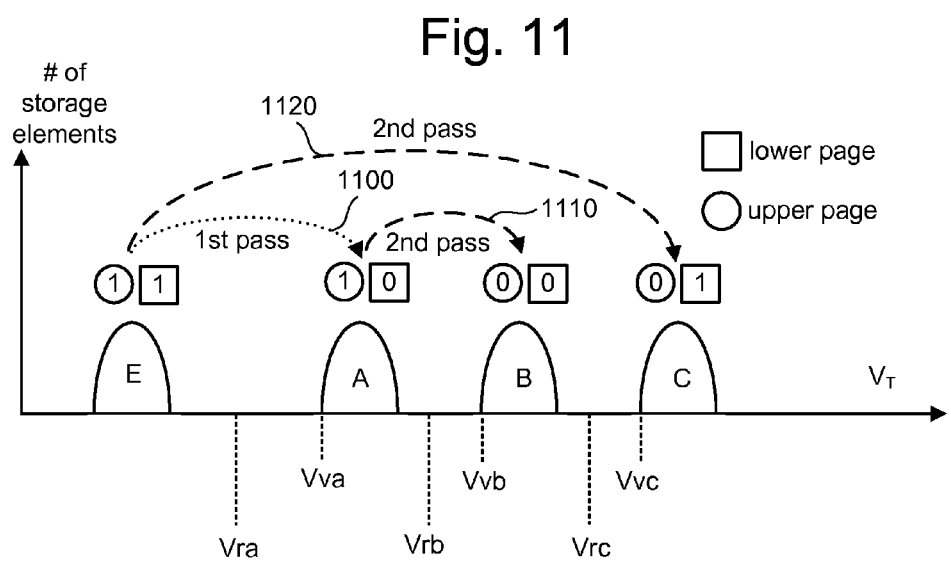
FIG. 11 depicts an example set of threshold voltage distributions.

FIG. 11 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 1120. If the storage element had been programmed into state A as a result of the first programming pass, then the storage element is further programmed in the second pass so that the threshold voltage is increased to be within state B, as depicted by arrow 1110. The result of the second pass is to program the storage element into the state designated to store a logic "0" for the upper page without changing the data for the lower page. In both FIG. 10 and FIG. 11 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. patent application Ser. No. 11/013,125, titled "Pipelined Programming of Non-Volatile Memories Using Early Data," filed on Dec. 14, 2004, by inventors Sergy A. Gorobets and Yan Li, (now U.S. Pat. No. 7,120,051), incorporated herein by reference in its entirety.

Figure 12A:
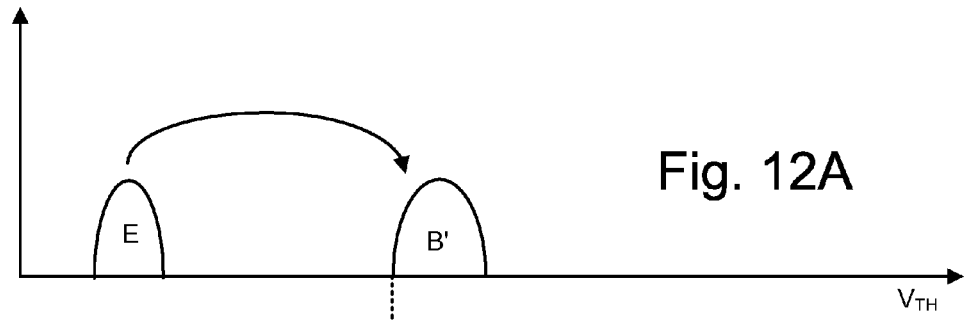
FIGS. 12A-C show various threshold voltage distributions and describe a process for programming non-volatile memory.
Figure 12B:
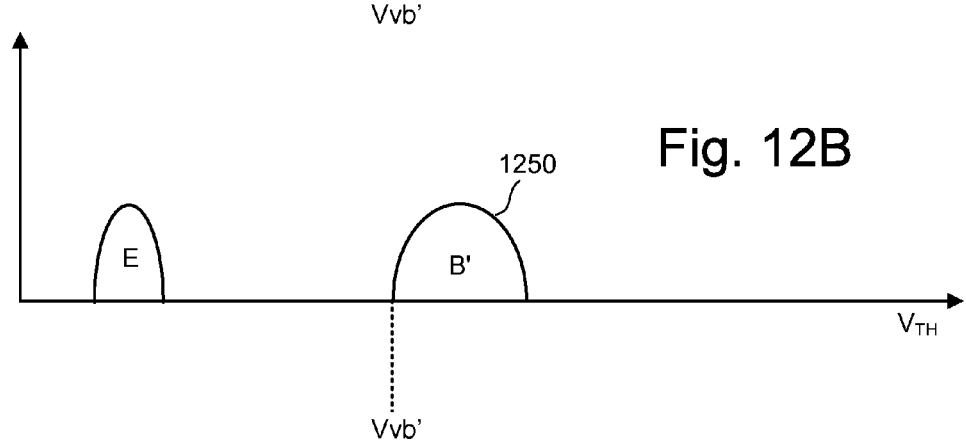
Figure 12C:
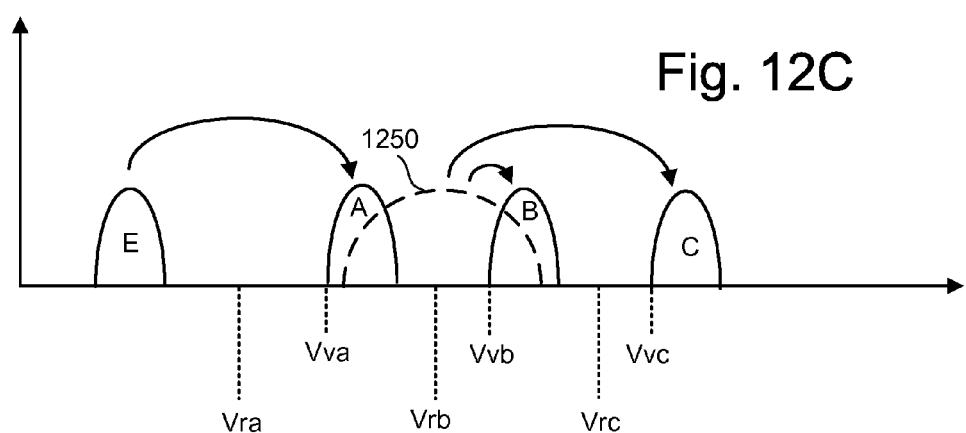

FIGS. 12A-C disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 12A therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1250 of FIG. 12B. This apparent widening of the threshold voltage distribution will be remedied when programming the upper page.

FIG. 12C depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 1250 and the upper page data is to remain at 1, then the storage element will be programmed to final state B. If the storage element is in intermediate threshold voltage distribution 1250 and the upper page data is to become data 0, then the threshold voltage of the storage element will be raised so that the storage element is in state C. The process depicted by FIGS. 12A-C reduces the effect of floating gate to floating gate coupling because only the upper page programming of neighbor storage elements will have an effect on the apparent threshold voltage of a given storage element. An example of an alternate state coding is to move from distribution 1250 to state C when the upper page data is a 1, and to move to state B when the upper page data is a 0.

Although FIGS. 12A-C provide an example with respect to four data states and two pages of data, the concepts taught by FIGS. 12A-C can be applied to other implementations with more or less than four states and different than two pages.

Figure 13:
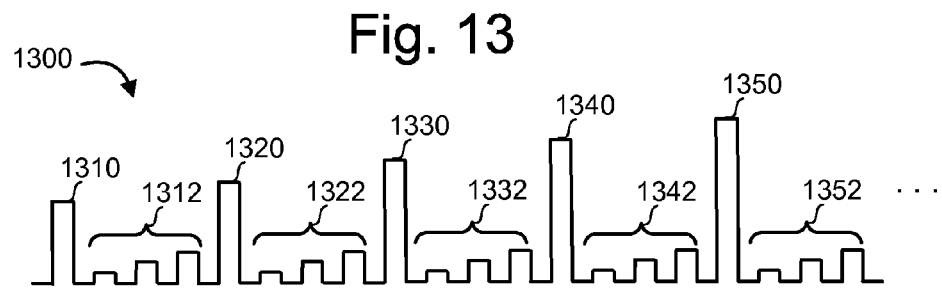
FIG. 13 is an example waveform applied to the control gates of non-volatile storage elements during programming.

FIG. 13 shows a voltage waveform 1300 which includes a series of program pulses 1310, 1320, 1330, 1340, 1350, . . . , that are applied to a word line selected for programming. In one embodiment, the programming pulses have a voltage, Vpgm, which starts at 12 V and increases by increments, e.g., 0.5 V, for each successive programming pulses until a maximum of 20 V is reached. In between the program pulses are sets of verify pulses 1312, 1322, 1332, 1342, 1352, . . . . In some embodiments, there can be a verify pulse for each state that data is being programmed into. In other embodiments, there can be more or fewer verify pulses. The verify pulses in each set can have amplitudes of Vva, Vvb and Vvc (FIG. 10), for instance.

In one embodiment, data is programmed to storage elements along a common word line. Thus, prior to applying the program pulses, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 2 is the selected word line, then WL1 is the source side neighboring word line and WL3 is the drain side neighboring word line.

Each block of storage elements includes a set of bit lines forming columns and a set of word lines forming rows. In one embodiment, the bit lines are divided into odd bit lines and even bit lines. Storage elements along a common word line and connected to the odd bit lines are programmed at one time, while storage elements along a common word line and connected to even bit lines are programmed at another time ("odd/even programming"). In another embodiment, storage elements are programmed along a word line for all bit lines in the block ("all bit line programming"). In other embodiments, the bit lines or block can be broken up into other groupings (e.g., left and right, more than two groupings, etc.).

Figure 14:
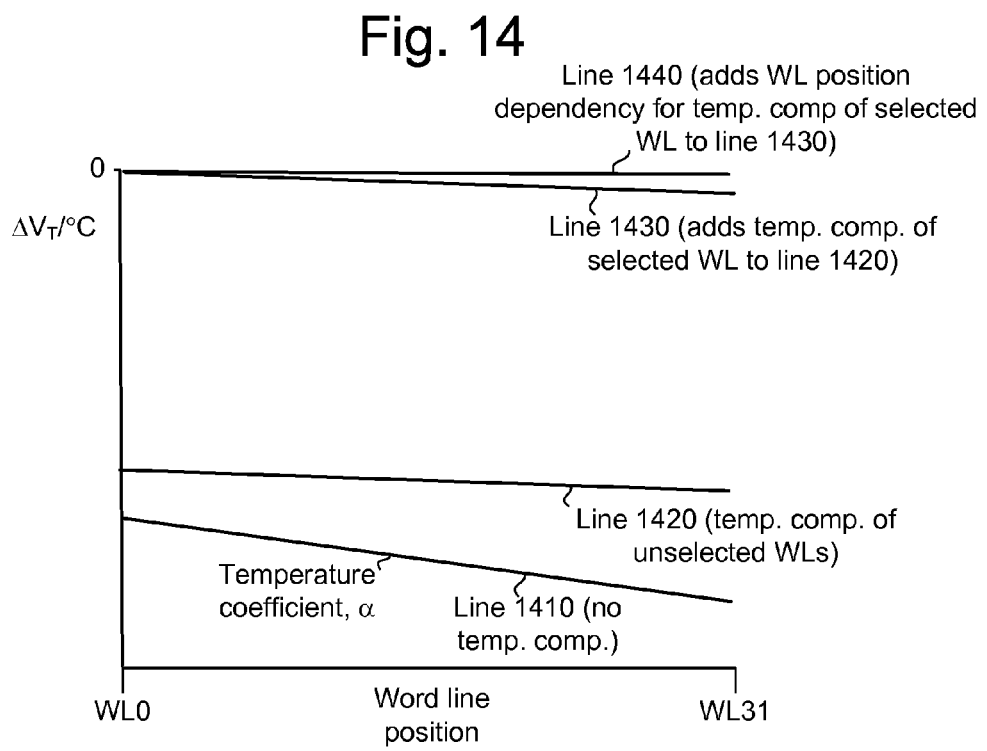
FIG. 14 illustrates a threshold voltage change with temperature and word line position.

FIG. 14 illustrates a threshold voltage change with temperature and word line position. Line 1410 denotes a temperature coefficient versus word line position relationship. Line 1420 denotes a ratio of change in threshold voltage to a change in temperature ($\Delta V_T/°$ C.) versus word line position, with temperature compensation of Vread, the voltage applied to the unselected word lines. In this case, the magnitude of the temperature dependency is reduced, while a word line position dependency remains, although the word line position dependency is reduced. Line 1430 denotes a $\Delta V_T/°$ C. versus word line position relationship, with temperature compensation of Vread, the voltage applied to the unselected word line, and of Vcgr, the voltage applied to the selected word line. In this case, the magnitude of the temperature dependency is reduced further relative to line 1420, while a word line position dependency still remains. Line 1440 denotes a $\Delta V_T/°$ C. versus word line position relationship, with temperature compensation of Vread, the voltage applied to the unselected word line, and of Vcgr, the voltage applied to the selected word line, with a further word line position dependency of Vcgr. In this case, the word line position dependency is essentially removed relative to the case of line 1430. A word line dependency may also be applied to the unselected word lines via Vread.

In particular, it has been observed that the threshold voltage of a non-volatile storage element decreases as temperature increases. The change in voltage relative to the change in temperature can be expressed in terms of a temperature coefficient ($\alpha$) which is typically about $-2$ mV/° C. The temperature coefficient depends on various characteristics of the memory device, such as doping, layout and so forth. Moreover, the temperature coefficient is expected to increase in magnitude as memory dimensions are reduced. The temperature coefficient can identify a ratio of a change in voltage or current to a change in temperature. With an operating range of $-40°$ C. to $+85°$ C., for instance, the threshold voltage can vary by about $(85-(-40)) \times (-2) = 250$ mV. Thus, the accuracy of a read or verify operation of one or more selected storage elements associated with a selected word line can be improved by biasing the read or verify voltage which is applied to the selected word line based on temperature. Furthermore, the temperature coefficient can vary according to word line position, as indicated by line 1410, when no word line-dependent temperature compensation is used. For example, line 1410 can have a value of about $-1.9$ mV/° C. at WL0, the source side word line, and a value of about $-2.1$ mV/° C. at WL31, the drain side word line, assuming there are thirty-two word lines in a block. Thus, the variation in the temperature coefficient is 0.2 mV across the word lines, in one possible design. Experimental data obtained from a 70 nm ABL architecture chip shows an approximately 15% change in average page temperature coefficient based on word line address, where WL31, having its series resistance completely on its source side, suffers more from temperature induced series resistance change on its source side, causing additional body effect, than a WL0 page, which also experiences a change in series resistance, albeit only at its drain side.

Various techniques are known for providing temperature-compensated read voltages to a selected word line. Most of these techniques do not rely on obtaining an actual temperature measurement, although this approach is also possible. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read", incorporated herein by reference, uses a bias generator circuit which biases a voltage which is applied to a source or drain of a data storage element. U.S. Pat. No. 5,172,338, titled "Multi-State EEPROM Read and Write Circuits and Techniques", incorporated herein by reference, describes a temperature-compensation technique which uses reference storage cells that are formed in the same manner as data storage cells and on the same integrated circuit chip. The reference storage cells provide reference levels against which measured currents or voltages of the selected cells are compared. Temperature compensation is provided since the reference levels are affected by temperature in the same manner as the values read from the data storage cells. Any of the these techniques, as well as any other known techniques, can be used to provide temperature-compensation of voltages of selected word lines, unselected word lines and/or select gates as described herein.

Thus, with the conventional techniques, the read or verify voltage applied to one or more selected storage elements via a selected word line is temperature compensated. However, the voltage which is applied to the remaining word lines, referred to as a read voltage, Vread, and the voltage which is applied to the select gates, referred to as Vsgs for the select gate, source or Vsgd for the select gate, drain, have not been temperature compensated. It has been thought that temperature-compensation of only the selected storage element is sufficient. In particular, it has been thought that the unselected storage elements and the select gates are over driven sufficiently beyond their threshold voltages such that changes in temperature do not significantly affect their conductivity. However, as transistors are scaled to ever smaller dimensions, their characteristics degrade, and the saturation currents deviate more and more from having a flat profile, as represented by a small slope in the graph of drain current ($I_D$) verses control gate voltage (Vcg).

To address these concerns, it is proposed that Vread, Vsgd, Vsgs, and any other critical transistor in the path of a storage element which is currently being read have temperature compensated biases applied to their gates, such that each transistor's on current becomes less dependent on temperature. By making these applied voltages track with temperature, the spreading of each state's threshold distribution which is caused by changes in temperature can be further reduced. This result can be taken advantage of in a number of ways which are not necessarily mutually exclusive. For example, Vread can be reduced. Thus, the amount of overdrive, that is, the extent to which Vread exceeds the threshold voltage of the highest programmed state of the storage elements, can be reduced, thereby reducing the associated read disturb caused by using high values of Vread.

This reduction of Vread is helpful with many different read/verify techniques. The reduction is particularly important with read/verify techniques which employ multiple read operations. For example, co-pending U.S. patent application Ser. No. 11/099,133, filed Apr. 5, 2005, to Jian Chen, titled "Compensating For Coupling During Read Operations Of Non-Volatile Memory", (now U.S. Pat. No. 7,196,928), Docket No. SAND-1040US0, incorporated herein by reference, describes a read technique in which multiple read operations at different levels are performed for the selected storage elements for each programming state. The increment between levels can be 50-100 mV, for instance. The technique combats the effects of word line-to-word line capacitive coupling, in which the threshold voltage of a previously programmed storage element is shifted higher when a neighboring storage element (typically a drain side neighbor) is subsequently programmed. If the shift is great enough, a read error can result. The coupling is highest when the neighboring storage element is programmed to a higher state, e.g., state C. To address this, one of the multiple read operations for each programming state is selected based on the state of the neighboring storage element on the neighboring word line which was programmed after the selected storage element.

In a variation of this technique, one read level is used for each state on the selected word line, as shown by the sets of verify pulses in FIG. 13, while the read voltage which is applied to the neighboring word line is adjusted. This variation is described in U.S. patent application Ser. No. 11/384,057, filed Mar. 17, 2006, to Nima Mokhlesi, titled "Read Operation For Non-Volatile Storage With Compensation For Coupling", (now US 2007/0206421), incorporated herein by reference. In either case, due to the increased number of read operations for reading the same amount of data, the exposure to read disturbs is increased. The temperature-compensation techniques provided herein mitigate this problem.

A further advantage of the temperature-compensation techniques provided herein is that the margin between threshold voltage distributions of various programming states, e.g., states E, A, B and C, can be increased as the spreading of each state's threshold voltage distribution which is caused by changes in temperature is reduced. Another advantage is that programming performance can be increased, such as by using a larger step size in the stair case series of programming pulses (FIG. 13) by consuming the increased margin between threshold voltage distributions of various programming states. Another advantage is that the entire memory operating window, e.g., the range of threshold voltages used to store data in the storage elements, can be reduced by packing the programming states closer together. This not only reduces both read and write disturbs, but also increases write performance because fewer programming pulses will be required to reach a desired programming state due to a smaller window.

Accuracy may be improved even further by providing a temperature-compensated voltage which accounts for a relative position of the selected word line among the other, unselected word lines which are associated with a set of non-volatile storage elements. The improvement in accuracy can be seen by comparing line 1440 to line 1430. This temperature compensation can be performed alone on the selected word line, or in conjunction with the temperature compensation of the unselected world lines. See FIG. 15b. A word line dependency can also be provided for the unselected word lines.

FIG. 15a is a timing diagram that explains the behavior of certain waveforms during read/verify operations, where temperature-compensated voltages are applied to all unselected word lines and to both select gates. In general, during read and verify operations, the selected word line or other control line is connected to a voltage, a level of which is specified for each read and verify operation, in order to determine whether a threshold voltage of the concerned storage element has reached such level. After applying the word line voltage, the conduction current of the storage element is measured to determine whether the storage element turned on. If the conduction current is measured to be greater than a certain value, then it is assumed that the storage element turned on and the voltage applied to the word line is greater than the threshold voltage of the storage element. If the conduction current is not measured to be greater than the certain value, then it is assumed that the storage element did not turn on and the voltage applied to the word line is not greater than the threshold voltage of the storage element.

There are many ways to measure the conduction current of a storage element during a read or verify operation. In one example, the conduction current of a storage element is measured by the rate it allows (or fails to allow) the NAND string that included the storage element to discharge the bit line. The charge on the bit line is measured after a period of time to see whether it has been discharged or not. In another embodiment, the conduction of the selected storage element allows current to flow or not flow on a bit line, which is measured by whether a capacitor in the sense amplifier is charged due to the flow of current. Both examples are discussed.

FIG. 15a shows waveforms SGD, WLunselected, WLn, SGS, Selected BL, and Source starting at a steady state voltage, Vss, of approximately 0 V. SGD represents the gate of the drain side select gate. WLunselected represents the unselected word lines. WLn is the word line selected for reading/verification. SGS is the gate of the source side select gate. Selected BL is the bit line selected for reading/verification. Source is the source line for the storage elements (see FIG. 4). Note that there are two versions of SGS and Selected BL depicted. One set of these waveforms SGS (option 1) and Selected BL (option 1), depict a read/verify operation for an array of storage elements that measure the conduction current of a storage element by determining whether the bit line has discharged. Another set of these waveforms SGS (option 2) and Selected BL (option 2), depict a read/verify operation for an array of storage elements that measure the conduction current of a storage element by the rate it discharges a dedicated capacitor in the sense amplifier.

First, the behavior of the sensing circuits and the array of storage elements that are involved in measuring the conduction current of a storage element by determining whether the bit line has discharged will be discussed with respect to SGS (option 1) and Selected BL (option 1). At time t1, SGD and SGS (option 2) are raised to Vsgd-tc and Vsgs-tc, respectively, where "tc" denotes a temperature-compensated voltage. Vsgd-tc and Vsgs are obtained by biasing Vsgd and Vsgs, respectively, for temperature. Vsgd and Vsgs are approximately 3.5 V, for instance. The temperature-compensation can be applied based on any of the above-mentioned compensation techniques, for instance. The unselected word lines are raised to Vread-tc. Vread-tc is obtained by biasing Vread for temperature. Vread is approximately 6 V, for instance. The selected word line is raised to Vcgr-tc (control gate read voltage), e.g., Vra, Vrb, or Vrc of FIG. 10, for a read operation, or to a verify level, e.g., Vva, Vvb, or Vvc of FIG. 10, for a verify operation. The Selected BL (option 1) is pre-charged to approximately 0.7 V, in one approach. Vread-tc, which is applied to the unselected word lines, acts as an overdrive voltage because it causes the unselected storage elements to turn on and act as pass gates. The overdrive voltage applied to an unselected storage element equals the amount by which the voltage applied to the control gate exceeds the threshold voltage.

As mentioned, Vread is chosen at a level which is sufficiently higher than the highest threshold voltage of a storage element to ensure that the unselected storage element is in a conductive or on state. For example, the threshold voltages for states E, A, B and C may be assumed to be −2 V, 0 V, 2 V and 4 V, respectively, and Vread, without temperature compensation, may be 6 V. In this case, a storage element in state E is overdriven by 6−(−2)=8 V, a storage element in state A is overdriven by 6−0=6 V, a storage element in state B is overdriven by 6−2=4 V, and a storage element in state C is overdriven by 6−4=2 V. Although the unselected storage element is in a conductive state in each case, its conductivity will vary based on the extent to which it is overdriven. An unselected storage element which is more overdriven is more conductive because it has less source-to-drain resistance and more current carrying capability. Similarly, an unselected storage element which is less overdriven is less conductive because it has more source-to-drain resistance and less current carrying capability. Thus, storage elements which are in the same NAND string as the selected storage element will have different conductivities based on their programming states even though they are all in a generally conductive state. The read level of the selected storage element will therefore be affected by the unselected storage elements based on their respective programming states.

Assuming a temperature compensation of −0.2 V, Vread-tc=6−0.2 V=5.8 V. The voltage applied to the select gates can be temperature compensated for similar reasons as for the unselected storage elements, thereby allowing a Vsgd-tc or Vsgs-tc of 3.5−0.2=3.3 V, for example. The temperature compensation of the unselected word lines and the select gates tends to make the reading of the threshold voltage of the selected word line more temperature-independent. As a result, each unselected storage element in series with the selected storage element will have a small effect, e.g., 3 mV, on the reading obtained for the threshold voltage of the selected storage element. While the effect of one unselected storage element on the reading is small, the cumulative effect of each of the unselected storage elements can add up to a significant level, e.g., 93 mV, when there are 31 unselected word lines. The effect of temperature-compensating the unselected world lines is more pronounced for memory devices with more word lines, and when reduced overdrive voltages are used.

At time t2, the NAND string can control the bit line. Also at time t2, the source side select gate is turned on by raising SGS (option 1) to Vsgs-tc. This provides a path to dissipate the charge on the bit line. If the threshold voltage of the storage element selected for reading is greater than Vcgr or the verify level applied to the selected word line WLn, then the selected storage element will not turn on and the bit line will not discharge, as depicted by line 1450. If the threshold voltage in the storage element selected for reading is below Vcgr-tc or below the verify level applied to the selected word line WLn, then the storage element selected for reading will turn on (conduct) and the bit line voltage will dissipate, as depicted by curve 1452. At some point after time t2 and prior to time t3 (as determined by the particular implementation), the sense amplifier will determine whether the bit line has dissipated a sufficient amount. In between t2 and t3, the sense amplifier measures the evaluated BL voltage. At time t3, the depicted waveforms will be lowered to Vss (or another value for standby or recovery).

Discussed next, with respect to SGS (option 2) and Selected BL (option 2), is the behavior of the sensing circuits and the array of storage elements that measure the conduction current of a storage element by the rate at which it charges a dedicated capacitor in the sense amplifier. At time t1, SGD is raised to Vsgd-tc, the unselected word lines (WLunselected) are raised to Vread-tc, and the selected word line (WLn) is raised to Vcgr-tc, e.g., Vra, Vrb, or Vrc, for a read operation, or to a verify level, e.g., Vva, Vvb, or Vvc, for a verify operation. In this case, the sense amplifier holds the bit line voltage constant regardless of what the NAND sting is doing, so the sense amplifier measures the current flowing with the bit line "clamped" to that voltage. At some point after time t1 and prior to time t3 (as determined by the particular implementation), the sense amplifier will determine whether the capacitor in the sense amplifier has dissipated a sufficient amount. At time t3, the depicted waveforms will be lowered to Vss (or another value for standby or recovery). Note that in other embodiments, the timing of some of the waveforms can be changed.

Figure 18:
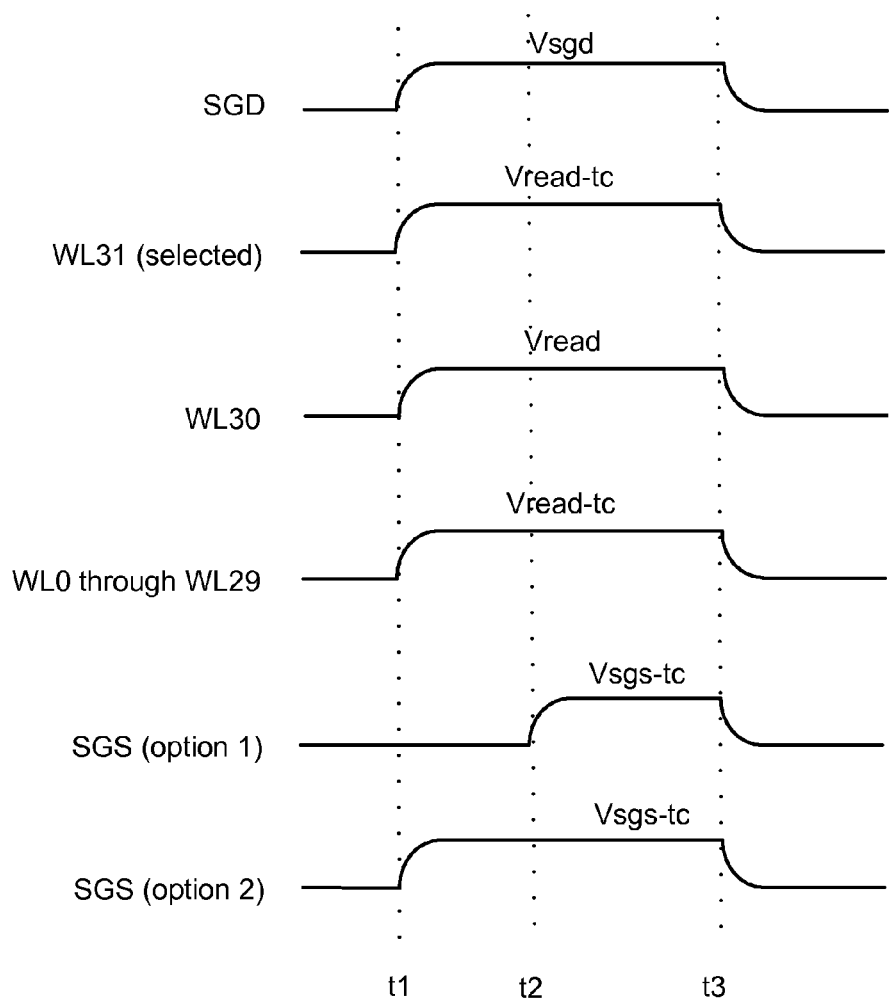
FIG. 18 is a timing diagram that explains the behavior of certain waveforms during read/verify operations, where the selected word line directly neighbors a drain side select gate.

FIG. 15b depicts the timing diagram of FIG. 15a in which different temperature-compensated voltages are applied to the selected word line based on word line position. As discussed in connection with FIG. 14, in one approach, a temperature compensation which is higher in magnitude (e.g., more negative) is can be applied to the selected word line when the position of the word line is closer to the drain than to the source. This is exemplified by the timing diagram of FIG. 15b, in which the temperature-compensated voltage which is applied to a selected word line which is closer to the source, e.g., WL0, is shown by a dashed line, while the temperature-compensated voltage which is applied to the selected word line which is closer to the drain, e.g., WL31, is shown by a solid line. A temperature-compensated voltage which is applied to the selected world line when it is intermediate to the source and drain is intermediate to the temperature-compensated voltages which are applied to the selected word line when it is at the source or drain side, in proportion to the distance from the source or drain, for instance. A word line position dependency can be provided for the voltages applied to one or more of the select gates and the unselected word lines as well. FIGS. 16-18 can be modified analogously to provide a word line position dependency.

FIG. 16 is a timing diagram that explains the behavior of certain waveforms during read/verify operations, where temperature-compensated voltages are applied to all unselected word lines, except the word lines directly neighboring a selected word line, and to both select gates. Waveforms SGD, SGS (option 1) and SGS (option 2) are the same as in FIG. 15a. The Selected BL and Source waveforms, not depicted, are also the same as in FIG. 15a. Note that the waveform labeled WL0 through WLn−2 represents the temperature-compensated read voltage which is applied to the word lines between and including the first word line, WL0, and a word line, WLn−2, which is next to a source-side neighbor word line, WLn−1, of the selected word line, WLn. The waveform labeled WLn+2 through WL31 represents the temperature-compensated read voltage which is applied to the word lines between and including the word line, WLn+2, which is next to a drain-side neighbor word line, WLn+1, of the selected word line, WLn, and WL31, which directly neighbors the drain side select gate, assuming there are thirty-two storage elements on a NAND string; however, a different number may be used. For these unselected word lines, temperature compensation is applied as discussed. Similarly, for the selected word line, WLn, a temperature-compensated control gate read voltage, Vcgr-tc, is applied.

For either or both of the word lines WLn−1 and WLn+1 which are direct neighbors of the selected word line, the applied read voltage is either not temperature compensated, or is temperature-compensated by a reduced amount, e.g., a substantially reduced amount, compared to the temperature-compensation applied to the other unselected word lines. An optimal compensation for a specific memory device can be determined by testing. It can be desirable to treat the word lines WLn−1 and WLn+1 differently than other word lines due to parasitic capacitance pathways between the selected storage element and the neighboring storage elements. That is, a temperature compensation voltage which is applied to the Vread of the neighboring storage elements can be capacitively coupled to the selected storage element, thereby shifting its threshold voltage higher. This can be problematic particularly for the above-mentioned read/verify techniques which employ multiple read levels for each programming state. Further, it may be desirable to treat word lines WLn−1 and WLn+1 differently from one another in regard to temperature compensation.

FIG. 17 is a timing diagram that explains the behavior of certain waveforms during read/verify operations, where the selected word line directly neighbors a source side select gate. Waveforms SGD, SGS (option 1) and SGS (option 2) are the same as in FIG. 15a. The Selected BL and Source waveforms, not depicted, are also the same as in FIG. 15a. Here, the selected word line, WL0, is a direct neighbor of the source side select gate. As mentioned, for some read/verify techniques, it may be desirable to not use temperature compensation for the read voltage which is applied to the transistors which neighbor the selected storage element. These neighboring transistors include the source side select gate on one side and the storage element associated with WL1 on the other side. Thus, in one possible approach, the voltages applied are not temperature compensated, or are temperature compensated by a lesser amount than the compensation applied to the other unselected word lines, and the other select gate, the drain side select gate, which is not a direct neighbor of the selected storage element. In particular, Vsgs can be applied to SGS, Vread-tc can be applied to WL0 and WL2 through WL31, Vread can be applied to WL1, and Vsgd-tc can be applied to SGD.

FIG. 18 is a timing diagram that explains the behavior of certain waveforms during read/verify operations, where the selected word line directly neighbors a drain side select gate. Waveforms SGD, SGS (option 1) and SGS (option 2) are the same as in FIG. 15a. The Selected BL and Source waveforms, not depicted, are also the same as in FIG. 15a. Here, the selected word line, WL31, is a direct neighbor of the drain side select gate. As mentioned, for some read/verify techniques, it may be desirable to not use temperature compensation for the read voltage which is applied to the transistors which neighbor the selected storage element. These neighboring transistors include the drain side select gate on one side and WL30 on the other side. Thus, in one possible approach, the voltages applied are not temperature compensated, or are temperature compensated by a lesser amount than the compensation applied to the other unselected word lines, and the other select gate, the source side select gate, which is not a direct neighbor of the selected storage element. In particular, Vsgs-tc can be applied to SGS, Vread-tc can be applied to WL0 through WL39, and WL31, Vread can be applied to WL30, and Vsgd can be applied to SGD. Thus, in the approaches of FIG. 17 and FIG. 18, the voltage applied to one or both select gates can be set to different levels, e.g., a temperature-uncompensated or compensated level, based on whether the neighboring storage element is selected or unselected, respectively.

Figure 19:
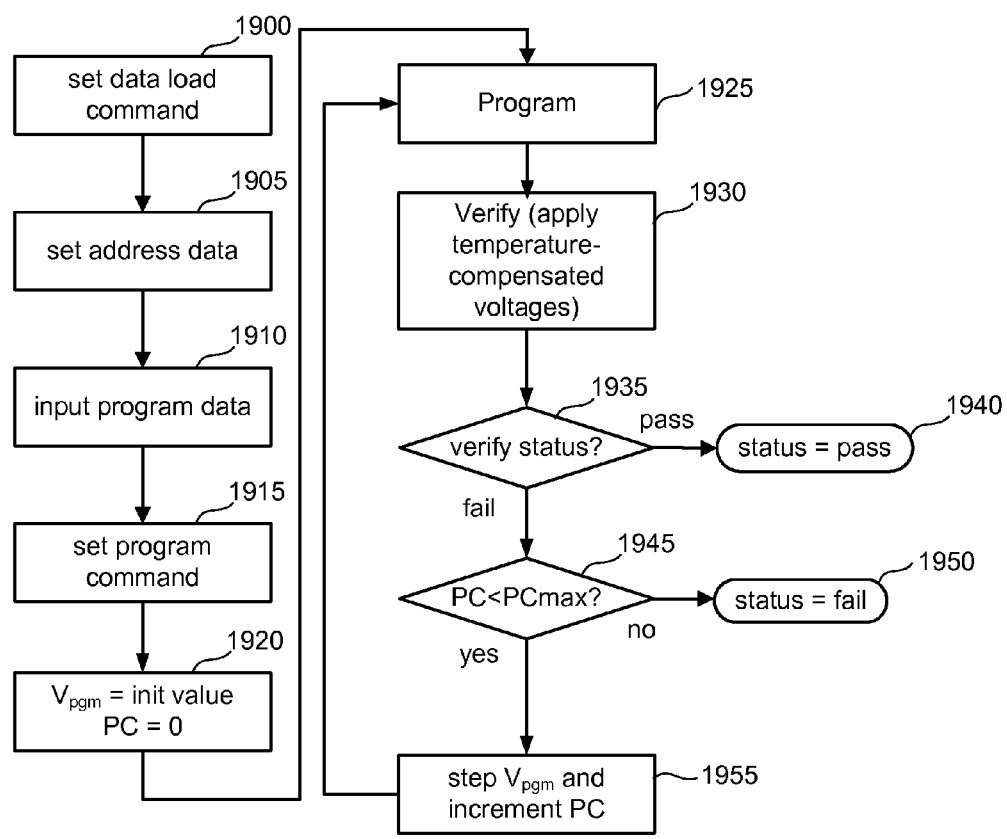
FIG. 19 is a flow chart describing one embodiment of a process for programming non-volatile memory.

FIG. 19 is a flow chart describing one embodiment of a method for programming non-volatile memory. In one implementation, storage elements are erased (in blocks or other units) prior to programming. In step 1900, a "data load" command is issued by the controller and input received by control circuitry 310. In step 1905, address data designating the page address is input to decoder 314 from the controller or host. In step 1910, a page of program data for the addressed page is input to a data buffer for programming. That data is latched in the appropriate set of latches. In step 1915, a "program" command is issued by the controller to state machine 312.

Triggered by the "program" command, the data latched in step 1910 will be programmed into the selected storage elements controlled by state machine 312 using the stepped pulses 1310, 1320, 1330, 1340, 1350, . . . of FIG. 13 applied to the appropriate word line. In step 1920, the program voltage, Vpgm, is initialized to the starting pulse (e.g., 12 V or other value) and a program counter PC maintained by state machine 312 is initialized at 0. In step 1925, the first Vpgm pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 1930, the states of the selected storage elements are verified using appropriate temperature-compensated voltages and voltages which are not temperature-compensated, or which are temperature-compensated by a reduced amount, as discussed. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 1935, it is checked whether all of the data latches are storing logic "1." If so, the programming process is complete and successful because all selected storage elements were programmed and verified. A status of "PASS" is reported in step 1940. In one embodiment, the verification of step 1930 includes providing temperature-compensated voltages to one or more unselected word lines, and to one or more select gates, as discussed previously in connection with FIGS. 15-18.

If, in step 1935, it is determined that not all of the data latches are storing logic "1," then the programming process continues. In step 1945, the program counter PC is checked against a program limit value PCmax. One example of a program limit value is twenty; however, other numbers can also be used. If the program counter PC is not less than PCmax, then the program process has failed and a status of "FAIL" is reported in step 1950. If the program counter PC is less than PCmax, then the Vpgm level is increased by the step size and the program counter PC is incremented in step 1955. After step 1955, the process loops back to step 1925 to apply the next Vpgm pulse.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   applying a first voltage to a selected word line to determine a programming condition of at least one non-volatile storage element which is associated with the selected word line, the at least one non-volatile storage element is provided in a set of non-volatile storage elements; and
   applying a second voltage to a select gate associated with the at least one non-volatile storage element, during at least a portion of a time in which the first voltage is applied, a level of the second voltage is set based on a position of the at least one non-volatile storage element relative to the select gate.

2. The method of claim 1, wherein:
   the second voltage is temperature-compensated when the at least one non-volatile storage element is not a direct neighbor of the select gate.

3. The method of claim 1, wherein:
   the second voltage is not temperature-compensated when the at least one non-volatile storage element is a direct neighbor of the select gate.

4. The method of claim 1, wherein:
   the second voltage is temperature-compensated by a first amount when the at least one non-volatile storage element is not a direct neighbor of the select gate; and
   the second voltage is not temperature-compensated, or is temperature-compensated by an amount which is less than the first amount, when the at least one non-volatile storage element is a direct neighbor of the select gate.

5. The method of claim 1, wherein:
   the first voltage comprises a read voltage for reading the programming condition of the at least one non-volatile storage element after the at least one non-volatile storage element has been programmed.

6. The method of claim 1, wherein:
   the first voltage comprises a verify voltage for determining whether the at least one non-volatile storage element has reached a desired programming condition.

7. The method of claim 1, wherein:
   the select gate and the at least one non-volatile storage element are in a NAND string.

8. The method of claim 7, wherein:
   the select gate is at a source side of the NAND string.

9. The method of claim 7, wherein:
   the select gate is at a drain side of the NAND string.

10. The method of claim 7, further comprising:
    applying an additional voltage to an additional select gate in the NAND string during at least a portion of a time in which the first voltage is applied, the second voltage is temperature compensated and the additional voltage is not temperature-compensated or is temperature-compensated less than the second voltage.

11. A non-volatile storage system, comprising:
    a set of non-volatile storage elements; and
    one or more circuits in communication with the set of non-volatile storage elements via a plurality of word lines, the one or more circuits: (a) apply a first voltage to a selected word line to determine a programming condition of at least one non-volatile storage element which is associated with the selected word line, the at least one non-volatile storage element is provided in the set of non-volatile storage elements, and (b) apply a second voltage to a select gate associated with the at least one non-volatile storage element, during at least a portion of a time in which the first voltage is applied, a level of the second voltage is set based on a position of the at least one non-volatile storage element relative to the select gate.

12. The non-volatile storage system of claim 11, wherein:
    the second voltage is temperature-compensated when the at least one non-volatile storage element is not a direct neighbor of the select gate.

13. The non-volatile storage system of claim 11, wherein:
    the second voltage is not temperature-compensated when the at least one non-volatile storage element is a direct neighbor of the select gate.

14. The non-volatile storage system of claim 11, wherein:
    the second voltage is temperature-compensated by a first amount when the at least one non-volatile storage element is not a direct neighbor of the select gate; and
    the second voltage is not temperature-compensated, or is temperature-compensated by an amount which is less than the first amount, when the at least one non-volatile storage element is a direct neighbor of the select gate.

15. The non-volatile storage system of claim 11, wherein:
    the first voltage comprises a read voltage for reading the programming condition of the at least one non-volatile storage element after the at least one non-volatile storage element has been programmed.

16. The non-volatile storage system of claim 11, wherein:
    the first voltage comprises a verify voltage for determining whether the at least one non-volatile storage element has reached a desired programming condition.

17. The non-volatile storage system of claim 11, wherein:
    the select gate and the at least one non-volatile storage element are in a NAND string.

18. The non-volatile storage system of claim 17, wherein:
    the select gate is at a source side of the NAND string.

19. The non-volatile storage system of claim 17, wherein:
    the select gate is at a drain side of the NAND string.

20. The non-volatile storage system of claim 17, wherein:
    the one or more circuits apply an additional voltage to an additional select gate in the NAND string during at least a portion of a time in which the first voltage is applied, the second voltage is temperature compensated and the additional voltage is not temperature-compensated or is temperature-compensated less than the second voltage.

* * * * *